(12) United States Patent
Jeong

(10) Patent No.: US 6,917,551 B2
(45) Date of Patent: Jul. 12, 2005

(54) MEMORY DEVICES, SENSE AMPLIFIERS, AND METHODS OF OPERATION THEREOF USING VOLTAGE-DEPENDENT CAPACITOR PRE-AMPLIFICATION

(75) Inventor: Gi-tae Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 10/646,961

(22) Filed: Aug. 22, 2003

(65) Prior Publication Data

US 2004/0071005 A1 Apr. 15, 2004

(30) Foreign Application Priority Data

Sep. 11, 2002 (KR) .................... 10-2002-0054904

(51) Int. Cl.[7] .................................................. G11C 7/00
(52) U.S. Cl. .................... 365/205; 365/207; 365/149
(58) Field of Search .............................. 365/205, 207, 365/149

(56) References Cited

U.S. PATENT DOCUMENTS 4,584,672 A 4/1986 Schutz et al.
5,612,912 A * 3/1997 Gillingham .................. 365/203
5,870,343 A * 2/1999 Chi et al. .................... 365/149
5,917,748 A * 6/1999 Chi et al. .................... 365/149

FOREIGN PATENT DOCUMENTS

KR 00164388 B1 9/1998

* cited by examiner

Primary Examiner—Van Thu Nguyen
Assistant Examiner—Tuan T. Nguyen
(74) Attorney, Agent, or Firm—Myers Bigel Sibley & Sajovec

(57) ABSTRACT

A memory device includes a memory cell configured to be coupled to complementary first and second bit lines and a differential amplifier having first and second input terminals and operative to amplify a voltage between the first and second input terminals to produce an output signal. First and second voltage-dependent capacitors are coupled to respective ones of the first and second input terminals, and first and second isolation switches are operative to couple and decouple the first and second bit lines to and from respective ones of the first and second voltage-dependent capacitors. The first and second isolation switches may include respective first and second isolation transistors (e.g., NMOS transistors), and the first and second voltage-dependent capacitors may include respective MOS capacitors.

12 Claims, 5 Drawing Sheets

MEMORY DEVICES, SENSE AMPLIFIERS, AND METHODS OF OPERATION THEREOF USING VOLTAGE-DEPENDENT CAPACITOR PRE-AMPLIFICATION

RELATED APPLICATION

This application claims the benefit of Korean Patent Application No. 2002-54904, filed on Sep. 11, 2002, the contents of which are herein incorporated by reference in their entirety.

BACKGROUND OF THE INVENTION

The present invention relates to memory devices, and more particularly, to sense amplifiers for memory devices.

A typical memory device includes means for storing binary data (in case of a DRAM, a capacitor), word lines for accessing the storage means, and a bit line for inputting/outputting data. A sense amplifier is typically utilized for amplifying and transforming data on a bit line to a binary logic signal.

Conventionally, to read data stored in a memory cell, at first a pair of bit lines (i.e., a bit line and a bit bar line) are equalized. Data stored in a specific memory cell is coupled to a bit line so that a small voltage difference may occur between the bit lines. The sense amplifier senses the small voltage difference between the bit lines and amplifies the same to generate a binary signal.

FIG. 1 is an equivalent circuit diagram of a conventional sense amplifier 10. A bit line BL and a bit bar line /BL are connected to the sense amplifier 10 to comprise two input terminals SI and /SI. The sense amplifier 10 senses a voltage difference between the bit line BL and the bit bar line /BL, i.e., a voltage difference ΔV (about 25–30 mV) between the two input terminals, and then amplifies the difference to produce a binary logic signal at output terminals SO and /SO.

A typical conventional sense amplifier comprises an NMOS transistor and a PMOS transistor. However, as minimum feature size decreases, the size of sense amplifiers generally has decreased. Consequently, efficiency of sense amplifiers has become highly susceptible to a change of fabrication processes. For example, it may be assumed that a transistor used in a sense amplifier has a channel length of 3000 Å. If a gate dimension varies by only 150 Å, the transistor threshold voltage can change 30 mV. This may mean that the sense amplifier cannot sense a voltage difference less than 30 mV, that is, if the voltage difference between the bit line BL and the bit bar line /BL becomes less than 30 mV, the sense amplifier may not be able to sense the difference.

Accordingly, when a conventional sense amplifier configuration is used, it can be difficult to achieve a high degree of integration in a memory device. In addition, performance of the sense amplifier may be easily affected by a change of fabrication processes.

SUMMARY OF THE INVENTION

According to some embodiments of the present invention, a memory device includes a memory cell configured to be coupled to complementary first and second bit lines, and a differential amplifier having first and second input terminals and operative to amplify a voltage between the first and second input terminals to produce an output signal. First and second voltage-dependent capacitors are coupled to respective ones of the first and second input terminals, and first and second switches are operative to couple and decouple the first and second bit lines to and from respective ones of the first and second voltage-dependent capacitors.

The first and second isolation switches may comprise, for example, respective first and second isolation transistors (e.g., NMOS transistors). The first and second voltage-dependent capacitors may comprise, for example, respective MOS capacitors.

The differential amplifier may comprise first and second output terminals, and first and second conductors that couple respective ones of the first and second input terminals to respective ones of the first and second output terminals. The differential amplifier may further include a first circuit (e.g., a pair of cross-coupled NMOS transistors) that is operative to drive one of the first and second conductors to a signal ground based on voltages at the first and second input terminals responsive to a first control signal, and a second circuit (e.g., a pair of cross coupled PMOS transistors) that is operative to drive one of the first and second conductors to a power supply voltage based on voltages at the first and second input terminals responsive to a second control signal.

According to further embodiments of the present invention, a sense amplifier includes a differential amplifier having first and second input terminals and operative to amplify a voltage between the first and second input terminals to produce an output signal. The sense amplifier further includes first and second voltage-dependent capacitors coupled to respective ones of the first and second input terminals, and first and second switches operative to couple and decouple first and second bit lines to and from respective ones of the first and second voltage-dependent capacitors.

According to some method embodiments of the present invention, terminals of first and second voltage-dependent capacitors are coupled to respective ones of complementary first and second bit lines to develop a voltage difference between the terminals of the first and second voltage-dependent capacitors responsive to data stored in a memory cell coupled to the first and second bit lines. The first and second bit lines are decoupled from the terminals of the first and second voltage-dependent capacitors to increase the voltage difference between the terminals of the first and second voltage-dependent capacitors. The increased voltage difference is amplified (e.g., by a sense amplifier) to generate an output signal indicative of the data stored in the memory cell.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when elements are referred to as being coupled to one another, this coupling may be direct or via one or more intervening elements.

Figure 1:
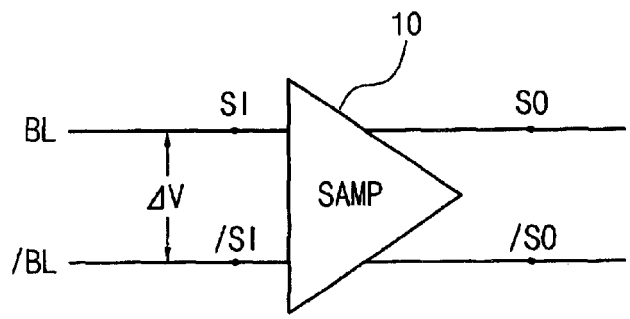
FIG. 1 is an equivalent circuit diagram of a conventional sense amplifier.
Figure 2:
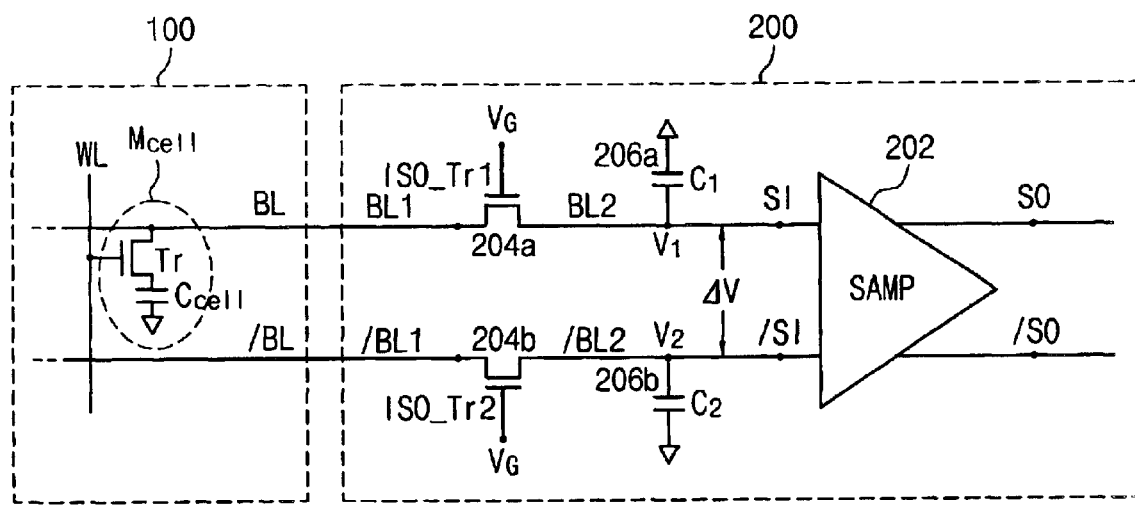
FIG. 2 is a schematic equivalent circuit diagram of a sense amplifier according to some embodiments of the present invention.

FIG. 2 is a schematic diagram of a semiconductor memory device according to some exemplary embodiments of the present invention. The semiconductor memory device includes a memory cell array 100 and a sense amplifier 200 that senses data stored cells of the cell array. For clarity, only one memory cell $M_{cell}$ is illustrated in the cell array 100. The memory cell $M_{cell}$ includes a cell capacitor $C_{cell}$ that stores information and an access transistor Tr to access the cell capacitor $C_{cell}$. A gate of the access transistor Tr is electrically connected to a word line WL (or the gate itself may act as a word line). A drain thereof is electrically connected to a bit line BL and a source thereof is electrically connected to the cell capacitor $C_{cell}$. The word line WL is a signal line for selecting the cell capacitor $C_{cell}$ and the bit line BL is a data line for inputting/outputting data to/from the cell capacitor $C_{cell}$.

The sense amplifier 200 includes a sense-amplifying means 202. The sense-amplifying means 202 senses and amplifies a voltage difference ΔV between input terminals SI and /SI to generate a binary logical signals at output terminals SO and /SO. One input of the sense amplifier 200 is a bit line BL2 connected to the specific memory cell capacitor $C_{cell}$ of the memory cell array and the other input is a bit bar line /BL2.

Figure 3:
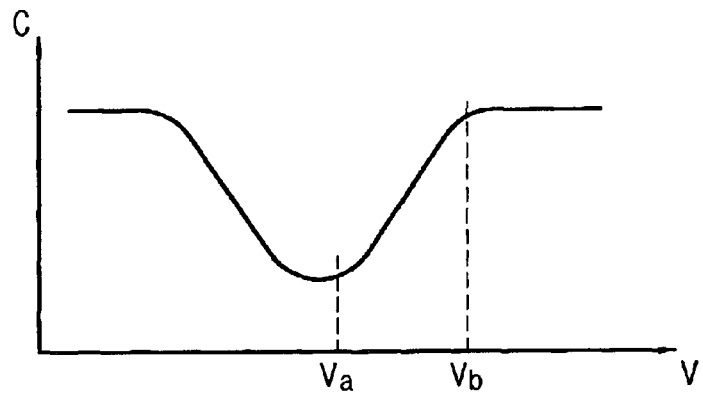
FIG. 3 is a V-C plot of a MOS capacitor.

The sense amplifier 200 further includes switches, here shown as bit line isolation transistors (ISO_Tr1) 204a and (ISO_Tr2) 204b, and voltage-dependant capacitors (C1) 206a and (C2) 206b. The bit line BL is isolated into two parts BL1 and BL2 by the bit line isolation transistor (ISO_Tr1) 204a. The voltage-dependant capacitor (C1) 206a and one terminal SI of the sense-amplifying means 202 are connected to the bit line BL2. Similarly, a bit bar line /BL is isolated into two parts /BL1 and /BL2 by a bit-line isolation transistor (ISO_Tr2) 204b. The voltage-dependant capacitor (C2) 206b and the other terminal /SI of the sense-amplifying means 202 are connected to the bit bar line /BL2. Preferably, the voltage-dependant capacitors (C1 and C2) 206a and 206b are MOS capacitors, i.e., MOS transistors having their sources and drains connected to a signal ground. A capacitance C of such a MOS capacitor changes depending on voltage V as illustrated in FIG. 3. For example, the capacitance C may be inversely proportional to voltage over a voltage range Va—Vb.

According to some embodiments of the present invention, capacitive coupling may occur between the bit-line isolation transistor 204a and the bit line BL2 and between the bit-line isolation transistor 204b and the bit bar line /BL2. Therefore, when the bit-line isolation transistor is turned on and then turned off, voltages on the capacitors C1 and C2 are changed due to capacitive coupling. As a result, an initial voltage difference |V1–V2| of the capacitors C1 and C2 (i.e., ΔV) may change. The capacitances of the voltage-dependant capacitors C1 and C2 are inversely proportional to voltage. Thus, if the bit-line isolation transistors (ISO_Tr1 and ISO_Tr2) 204a, 204b are turned on and then turned off, a voltage difference becomes much larger than the initial voltage difference ΔV.

That is, when an identical pre-charge voltage is applied to the bit line BL and the bit bar line /BL and a word line driving signal is activated, a particular cell $M_{cell}$ is selected from memory cell arrays and charge sharing occurs between the selected cell $M_{cell}$ and the bit line BL. If the bit-line isolation transistors are turned on, a small voltage difference ΔV may develop between two input terminals of the sense-amplifying means 202 (i.e., the bit lines BL2 and the bit bar line /BL2). In other words, the small voltage difference ΔV may be generated between the two capacitors.

If the bit-line isolation transistors 204a and 204b are turned off, voltages of the MOS capacitors 206a and 206b vary due to the voltage-dependant capacitance of the MOS capacitors 206a, 206b. In this case, the capacitance of the MOS capacitors 206a and 206b are inversely proportional to the voltages, so that a voltage difference ΔV of the MOS capacitors after the turning-off of the transistors 204a and 204b may become larger than the initial small voltage difference ΔV. The variation of the voltage difference depends on a degree of the capacitive coupling, i.e., the larger the degree of capacitive coupling, the larger the voltage difference. Thus, it is preferable that the capacitive coupling be as large as possible.

If the sense-amplifying means 202 is activated, a signal having large voltage difference is inputted into the sense-amplifying means 202, so that the sense-amplifying means 202 may operate stably. After the sense-amplifying means 202 becomes activated, the word line-driving signal is inactivated.

Figure 4:
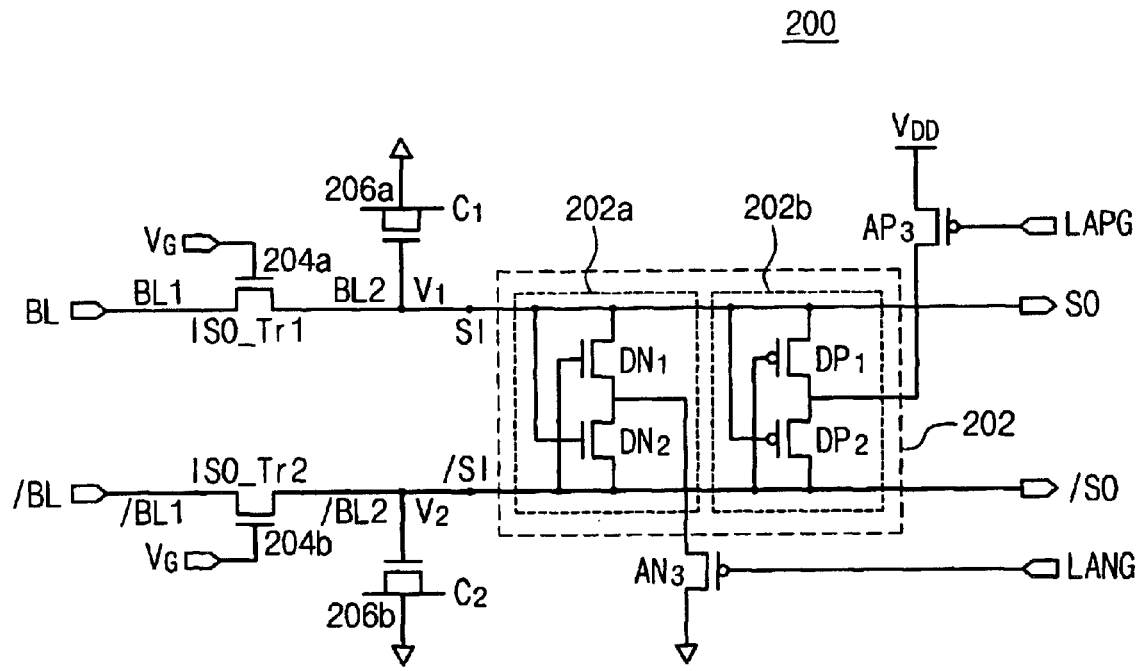
FIG. 4 is a schematic circuit diagram of a sense amplifier according to additional embodiments of the present invention.

FIG. 4 illustrates an exemplary implementation of the sense amplifier 200 of FIG. 2. Referring to FIG. 4, bit-line isolation transistors (ISO_Tr1 and ISO_Tr2) 204a, 204b are turned on/off by a separation signal (i.e., a turn-on voltage $V_G$) to isolate a bit line BL1 from a bit line BL2, and to isolate a bit bar line /BL1 and a bit bar line /BL2. Voltage-dependant capacitors 206a and 206b are MOS capacitors having sources and drain that are grounded. Drains of the bit-line isolation transistors 204a and 204b are connected to the portion BL1 of the bit line BL and the portion /BL1 of the bit bar line /BL, respectively. Sources thereof are connected to gates of respective ones of the voltage-dependent MOS capacitors 206a and 206b. The gates of the voltage-dependant capacitors 206a and 206b are connected to respective ones of the bit line portions BL2 and /BL2, which form input terminals of the sense-amplifying means 202.

The sense-amplifying means 202 comprises an NMOS sense-amplifying means 202a and a PMOS sense-amplifying means 202b. The NMOS sense-amplifying means 202a comprises a couple of NMOS transistors DN1 and DN2, the sources of which are connected to each other. A drain of the NMOS transistor DN1 is connected to the bit line BL2 and a gate of the NMOS transistor DN1 is connected to the bit line /BL2. A drain of the NMOS transistor DN2 is connected to the bit bar line /BL2 and a gate of the NMOS transistor DN2 is connected to the bit line BL. An activation signal LANG is applied to the NMOS sense-amplifying means 202a through an activation NMOS transistor AN3 that is connected between the common source of the NMOS sense-amplifying means 202a and a ground electrode.

The PMOS sense-amplifying means 202b comprises a couple of PMOS transistors DP1 and DP2, the sources of which are connected to each other. A drain of the PMOS transistor DP1 is connected to the bit line BL2 and a gate of the PMOS transistor P1 is connected to the bit bar line /BL2. A drain of the PMOS transistor PN2 is connected to the bit bar line /BL2 and a gate of the PMOS transistor PN2 is connected to a bit line BL2. An activation signal LAPG is applied to the PMOS sense-amplifying means 202b through an activated PMOS transistor AP3 connected between the common source of the PMOS sense-amplifying means 202b and a power supply $V_{DD}$. The PMOS transistors DP1 and DP2 of the PMOS sense-amplifying means 202b serve as output terminals SO and /SO of the sense amplifier.

Figure 5A:
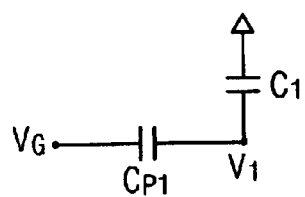
FIGS. 5A and 5B are equivalent circuit diagrams showing capacitive coupling between a bit-line isolation transistor and the bit line of FIG. 4.
Figure 5B:
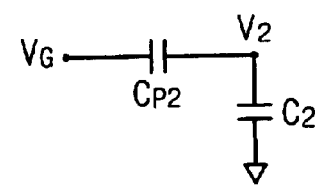

FIGS. 5a and 5b are equivalent circuit diagrams illustrating capacitive coupling between the bit-line isolation transistor 204a and the bit line BL2, and between the bit-line transistor 204b and the bit bar line/BL2, respectively. A parasitic capacitor Cp1 occurs between a gate and a source of the bit-line isolation transistor 204a, and a parasitic capacitor Cp2 occurs between a gate and a source of the bit-line isolation transistor 204b.

Figure 6:
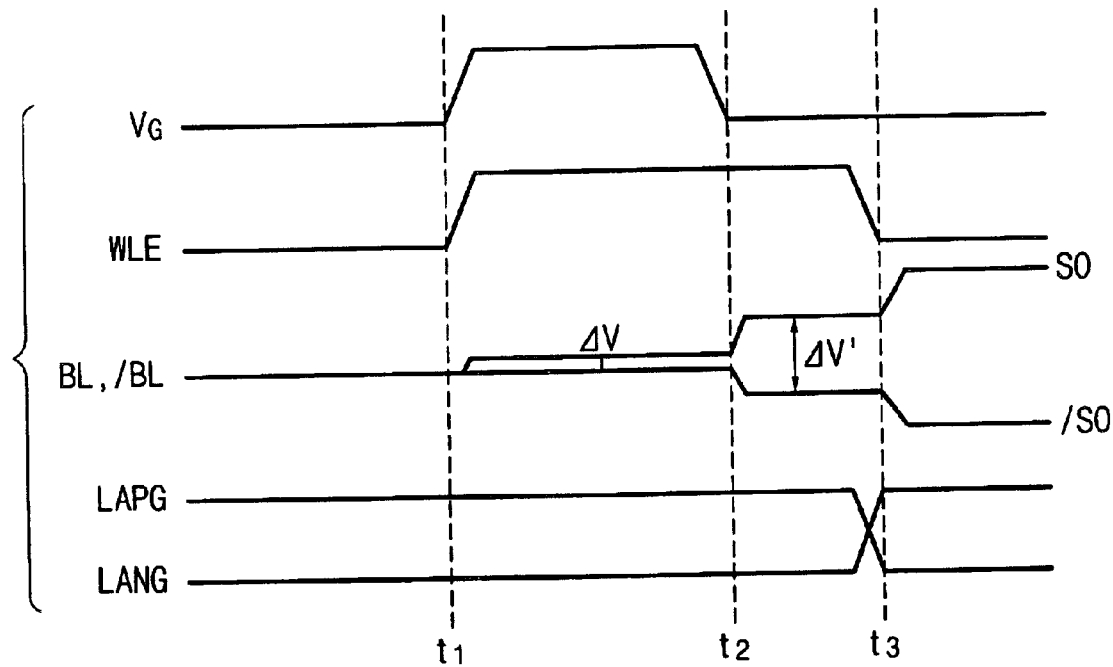
FIG. 6 is a timing diagram showing exemplary sensing and amplifying operations of a sense amplifier according to some embodiments of the present invention.

Referring to FIG. 6, if the bit line isolation transistors 204a and 204b are turned off by the turn-on voltage $V_G$, turn-on voltage $V_G$ (i.e., gate voltage) is capacitively coupled to the bit lines BL2 and /BL2. Therefore, voltages V1 and V2 of the MOS capacitors C1 and C2 may change. A capacitance of the MOS capacitor depends on voltage and is inversely proportional to the same, so that an initial voltage difference ΔV is amplified to become a voltage difference ΔV'.

Referring to FIGS. 4 and 6, exemplary sense-amplifying operations in accordance with some embodiments of the present invention will now be explained. A bit line BL and a bit bar line /BL are pre-charged with a predetermined voltage $V_{BLP}$. A word line driving signal WLE and a separation signal $V_G$ are activated to turn on the bit-line isolation transistors 204a and 204b at time t1, and a small voltage difference ΔV develops between the two input bit lines BL2 and /BL2 of the sense-amplifying means 202 (i.e., between a voltage-dependant capacitors) due to charge sharing. The voltage difference may be, for example, about 25 mV–35 mV. At time t2, if the bit-line isolation transistors 204a and 204b are turned off, a capacitive coupling may occur between the bit-line isolation transistors and the bit lines BL2 and /BL2. Therefore, an amplified voltage difference ΔV' much larger than the initial small voltage difference ΔV is developed between the two bit lines BL2 and /BL2 of input terminals SI and /SI of the sense-amplifying means 200 during an interval from time t2 to time t3.

At time t3, control signals LANG and LAPG are activated to activate the NMOS sense-amplifying means 202a and the PMOS sense-amplifying means 202b, respectively. The control signal LANG changes from a logic low state to a logic high state at t3 and the control signal LAPG changes from a logic high state to a logic low state at time t3. The NMOS and PMOS sense-amplifying means are activated to sense and amplify the amplified voltage difference ΔV'. After these are activated, the word line driving signal is inactivated.

Figure 7A:
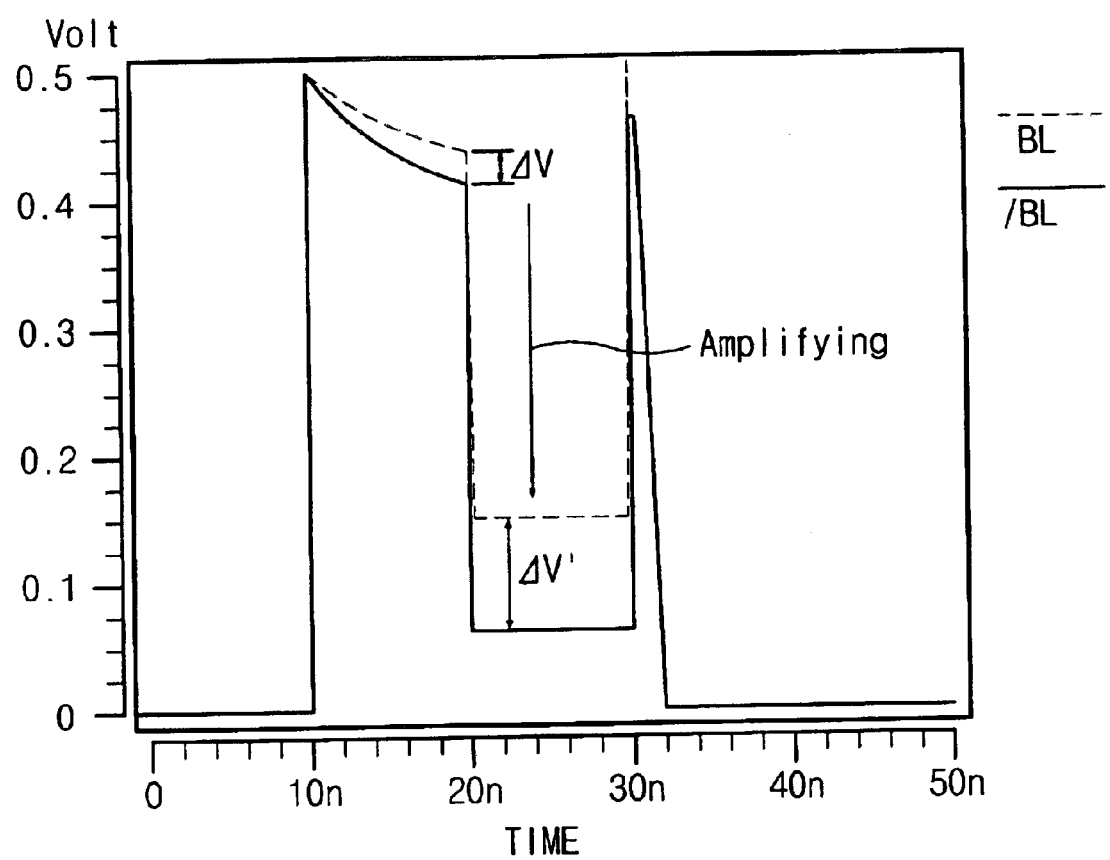
FIGS. 7A to 7B show voltage differences between a bit line and a bit bar line before and after turning on and turning off a bit-line isolation transistor in a sense amplifier according to some embodiments of the present invention.
Figure 7B:
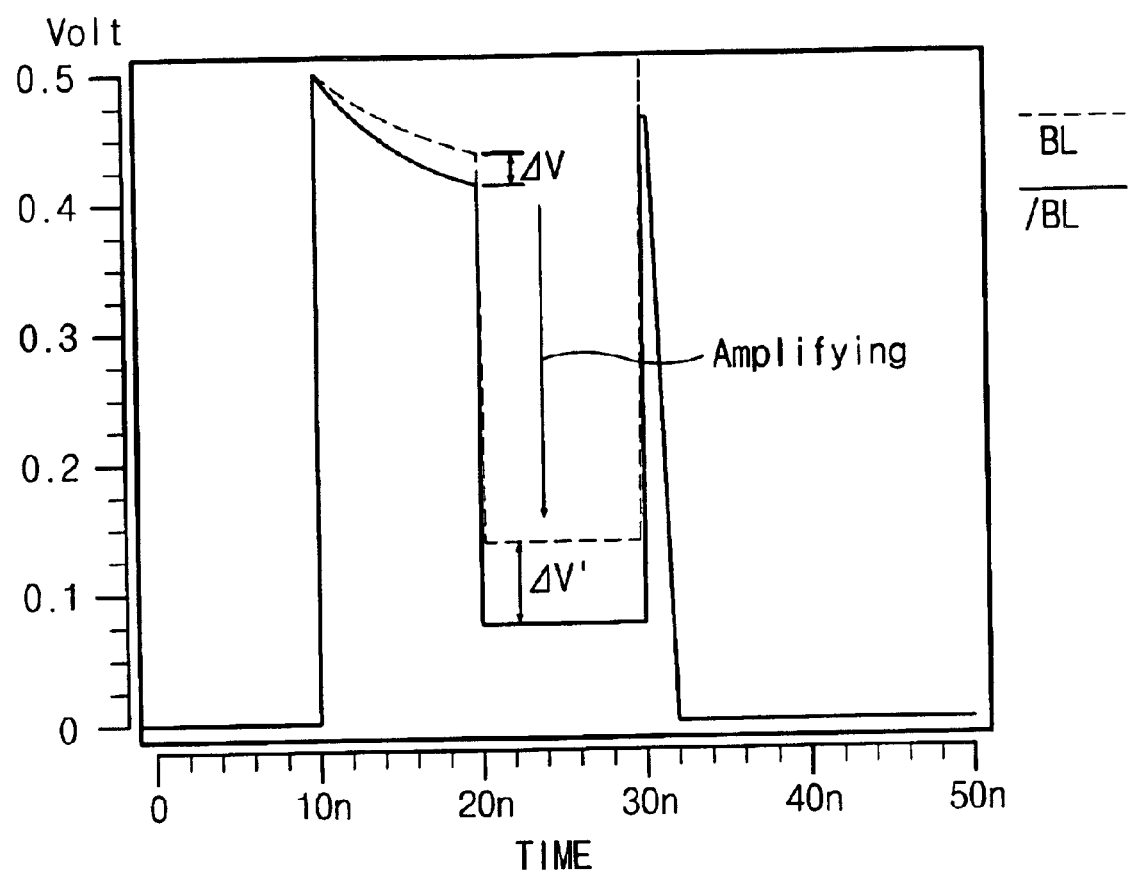

FIGS. 7a and 7b are simulation results showing a voltage between a bit line and a bit bar line (i.e., a voltage differences applied to the sense-amplifying means) before and after turning on or off the bit-line isolation transistor in accordance with some embodiments of the present invention. FIG. 7a shows a simulation result assuming the sense-amplifying means is ideal, and FIG. 7b shows a simulation result assuming a gate dimension of a transistor of the sense-amplifying means differs 5%. In the simulations, an operation voltage Vcc of the transistor is 2V. A solid line refers to a bit line and a dotted line refers to a bit bar line in the drawings. The horizontal axis represents time and the vertical axis represents voltages of the bit line and the bit bar line.

Referring to FIG. 7a, when the bit-line isolation transistor is tuned on at 10 nsec, a voltage difference between the bit line and the bit bar line increases by charge sharing to generate an initial voltage difference ΔV at 20 nsec. When the bit-line isolation transistor is turned off at 20 nsec, an amplified voltage difference ΔV' of about 87.5 mV is maintained during 20 nsec–30 nsec due to capacitive coupling.

Referring to FIG. 7b, after tuning off the bit-line isolation transistor, an initial voltage difference of 25 mV is amplified to become 62.5 mV. Therefore, even if a gate dimension of the sense-amplifier varies as memory devices are highly integrated, an initial small voltage difference is amplified so that the sense amplifier may sense the voltage difference.

According to some embodiments of the present invention, after a bit-line isolation transistor is turned off to amplify a small voltage difference between bit lines, and then a sense amplifier is activated to sense-amplify the previously amplified signal. Therefore, even if a gate dimension is varied due to a change of fabrication processes, the sense amplifier can perform a valid sensing operation. This approach can be advantageous for high integration and, especially, for a device having a small sense signal such as, for example, a magnetic resistance memory device (MRAM).

In the drawings and specification, there have been disclosed typical embodiments of the invention and, although specific terms are employed, they are used in a generic and descriptive sense only and not for purposes of limitation, the scope of the invention being set forth in the following claims. Although the invention has been described with reference to particular embodiments, it will be apparent to one of ordinary skill in the art that modifications of the described embodiments may be made without departing from the spirit and scope of the invention

What is claimed is:

1. A memory device, comprising:
   a memory cell configured to be coupled to complementary first and second bit lines;
   a differential amplifier having first and second input terminals and operative to amplify a voltage between the first and second input terminals to produce an output signal;
   first and second voltage-dependent capacitors coupled to respective ones of the first and second input terminals; and
   first and second switches operative to couple and decouple the first and second bit lines to and from respective ones of the first and second voltage-dependent capacitors.

2. A device according to claim 1, wherein the first and second switches comprise respective first and second isolation transistors.

3. A device according to claim 2, wherein the first and second isolation switches comprise respective first and second NMOS transistors.

4. A device according to claim 1, wherein the first and second voltage-dependent capacitors comprise respective MOS capacitors.

5. A device according to claim 1, wherein the differential amplifier comprises:

first and second output terminals;

first and second conductors that couple respective ones of the first and second input terminals to respective ones of the first and second output terminals;

a first circuit operative to drive one of the first and second conductors to a signal ground based on voltages at the first and second input terminals responsive to a first control signal; and a second circuit operative to drive one of the first and second conductors to a power supply voltage based on voltages at the first and second input terminals responsive to a second control signal.

6. A device according to claim 5:

wherein the first circuit comprises:

a first NMOS transistor having a drain coupled to the first conductor and a gate coupled to the second conductor;

a second NMOS transistor having a drain couple to the second conductor, a gate coupled to the first conductor, and a source coupled to a source of the first NMOS transistor and configured to receive the first control signal;

wherein the second circuit comprises:

a first PMOS transistor having a drain coupled to the first conductor and a gate coupled to the second conductor; and a second PMOS transistor having a drain couple to the second conductor, a gate coupled to the first conductor, and a source coupled to a source of the first PMOS transistor and configured to receive the second control signal.

7. A sense amplifier, comprising:

a differential amplifier having first and second input terminals and operative to amplify a voltage between the first and second input terminals to produce an output signal;

first and second voltage-dependent capacitors coupled to respective ones of the first and second input terminals; and first and second switches operative to couple and decouple first and second bit lines to and from respective ones of the first and second voltage-dependent capacitors.

8. A sense amplifier according to claim 7, wherein the first and second switches comprise respective first and second isolation transistors.

9. A sense amplifier according to claim 8, wherein the first and second isolation switches comprise respective first and second NMOS transistors.

10. A sense amplifier according to claim 7, wherein the first and second voltage-dependent capacitors comprise respective MOS capacitors.

11. A sense amplifier according to claim 7, wherein the differential amplifier comprises:

first and second output terminals;

first and second conductors that couple respective ones of the first and second input terminals to respective ones of the first and second output terminals;

a first circuit operative to drive one of the first and second conductors to a signal ground based on voltages at the first and second input terminals responsive to a first control signal; and a second circuit operative to drive one of the first and second conductors to a power supply voltage based on voltages at the first and second input terminals responsive to a second control signal.

12. A sense amplifier according to claim 11:

wherein the first circuit comprises:

a first NMOS transistor having a drain coupled to the first conductor and a gate coupled to the second conductor;

a second NMOS transistor having a drain couple to the second conductor, a gate coupled to the first conductor, and a source coupled to a source of the first NMOS transistor and configured to receive the first control signal;

wherein the second circuit comprises:

a first PMOS transistor having a drain coupled to the first conductor and a gate coupled to the second conductor;

a second PMOS transistor having a drain couple to the second conductor, a gate coupled to the first conductor, and a source coupled to a source of the first PMOS transistor and configured to receive the second control signal.

* * * * *